(12) United States Patent
Masuda et al.

(10) Patent No.: US 7,808,012 B2
(45) Date of Patent: Oct. 5, 2010

(54) GROUP OF PHOSPHOR PARTICLES FOR LIGHT-EMITTING DEVICE, LIGHT-EMITTING DEVICE AND BACKLIGHT FOR LIQUID CRYSTAL DISPLAY

(75) Inventors: Masatsugu Masuda, Higashihiroshima (JP); Kenji Terashima, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 187 days.

(21) Appl. No.: 12/171,946

(22) Filed: Jul. 11, 2008

(65) Prior Publication Data

US 2009/0014741 A1    Jan. 15, 2009

(30) Foreign Application Priority Data

Jul. 13, 2007   (JP)   ............................. 2007-184440

(51) Int. Cl.
*H01L 33/00*   (2010.01)
(52) U.S. Cl. .............................. 257/98; 257/88; 257/89; 331/502; 331/503; 438/22; 438/48; 438/52
(58) Field of Classification Search ........... 257/80–100; 313/486–503; 438/22, 48, 52
See application file for complete search history.

(56) References Cited

U.S. PATENT DOCUMENTS

| 6,686,691 | B1 | 2/2004 | Mueller et al. | |
|---|---|---|---|---|
| 6,812,500 | B2 | 11/2004 | Reeh et al. | |
| 7,345,317 | B2 | 3/2008 | Reeh et al. | |
| 2006/0226759 | A1* | 10/2006 | Masuda et al. | 313/486 |
| 2007/0054065 | A1 | 3/2007 | Shutou | |
| 2008/0093979 | A1* | 4/2008 | Bechtel et al. | 313/503 |
| 2009/0267484 | A1* | 10/2009 | Kasakura et al. | 313/502 |

FOREIGN PATENT DOCUMENTS

| JP | 2002-60747 A | 2/2002 |
|---|---|---|
| JP | 2003-121838 A | 4/2003 |
| JP | 2003-321675 A | 11/2003 |
| JP | 2004-210921 A | 7/2004 |
| JP | 2004-287323 A | 10/2004 |
| JP | 2007-049114 A | 2/2007 |

* cited by examiner

*Primary Examiner*—Dung A. Le
(74) *Attorney, Agent, or Firm*—Morrison & Foerster LLP

(57) ABSTRACT

A group of phosphor particles for a light-emitting device contains a plurality of types of phosphor particles having different emission peak wavelengths, while phosphor particles of a type having a relatively longer emission peak wavelength have a relatively larger median diameter as compared with phosphor particles of a type having a relatively shorter emission peak wavelength.

7 Claims, 2 Drawing Sheets

US 7,808,012 B2

GROUP OF PHOSPHOR PARTICLES FOR LIGHT-EMITTING DEVICE, LIGHT-EMITTING DEVICE AND BACKLIGHT FOR LIQUID CRYSTAL DISPLAY

This nonprovisional application is based on Japanese Patent Application No. 2007-184440 filed on Jul. 13, 2007 with the Japan Patent Office, the entire contents of which are hereby incorporated by reference.

BACKGROUND OF THE INVENTION

1. Field of the Invention

The present invention relates to improvement of a group of phosphor particles utilized for a light-emitting device, and more specifically to improvement of luminous efficiency and color rendering properties (or color reproducibility) of a light-emitting device utilizing a group of phosphor particles containing a plurality of types of luminescent materials having different fluorescent peak wavelengths.

2. Description of the Background Art

A white light-emitting device formed by combining a semiconductor light-emitting element and luminescent materials is noted as the next-generation light-emitting device expected to have low power consumption, a small size, high brightness, wide-ranging color reproducibility and high color rendering properties, and is actively researched and developed.

In such a white light-emitting device, light having a wavelength in the range of the longer wavelength side of ultraviolet light to blue, i.e., about 380 nm to 480 nm, is employed as primary light emitted from the semiconductor light-emitting element. There is also proposed a luminescence converter utilizing various types of luminescent materials suitable for converting this primary light to secondary light.

Conventionally, it is usual for this type of white light-emitting device to mainly use a combination of a semiconductor light-emitting element for emitting blue light (peak wavelength: about 460 nm) and a trivalent-cerium-activated $(Y,Gd)_3(Al,Ga)_5O_{12}$ luminescent material or a divalent-europium-activated $2(Sr,Ba,Ca)O.SiO_2$ luminescent material to be excited by the blue light so as to emit yellow light.

However, the general color rendering index (Ra) related to such a conventional white light-emitting device is about 70, and particularly the special color rendering index (R9) indicating the degree of rendering of red is at an extremely inferior level of about −40 in the present circumstances. In other words, the conventional white light-emitting device is excessively unsuitable for a general illumination source. The definition and significance of the general and special color rendering indices are specified in JIS also.

Further, the conventional white light-emitting device has insufficient color reproducibility of about 70% according to the NTSC ratio. Nowadays improvement of color reproducibility is demanded also in a small-sized LCD (liquid crystal display) (LCD of a portable telephone, for example). The chromaticity coordinates (x, y) of red, green and blue are (0.670, 0.330), (0.210, 0.710) and (0.140, 0.080) respectively in the chromaticity diagram of XYZ color coordinate system defined by NTSC (National Television System Committee), and the NTSC ratio denotes the ratio to the area of a triangle obtained by connecting these chromaticity coordinates of red, green and blue.

In other words, the white light-emitting device formed by combining the semiconductor light-emitting element and the luminescent materials must be improved in color rendering properties, in the case that it is used as an illumination source. Further, the white light-emitting device must be improved also in color reproducibility (NTSC ratio), in the case that it is used as a backlight for a medium- or small-sized LCD.

For example, Japanese Patent Laying-Open No. 2002-060747 discloses an invention related to color rendering properties of a white light-emitting device formed by combining a semiconductor light-emitting element and luminescent materials. In relation to the white light-emitting device, this Patent Document describes that a general color rendering index (Ra) of 70 to 90 can be obtained when $SrGa_2S_4:Eu^{2+}$ and $SrS:Eu^{2+}$ are employed mainly as green and red luminescent materials, respectively.

However, the thiogallate ($SrGa_2S_4:Eu^{2+}$) and the sulfide ($SrS:Eu^{2+}$) are chemically instable, and particularly the sulfide is easily decomposed when irradiated with ultraviolet light.

Japanese Patent Laying-Open No. 2003-321675 describes in relation to a white light-emitting device that a general color rendering index (Ra) of 75 to 95 can be obtained by utilizing a luminescent material YAG:Ce for emitting yellow light and a nitride luminescent material (general formula: $L_xM_yN_{(2/3x+4/3y)}$) such as $Ca_{1.97}Si_5N_8:Eu_{0.03}$ for emitting red light and that reddish white light can also be obtained by increasing the value of a special color rendering index (R9) related to red.

When a semiconductor light-emitting element for emitting blue light is combined with the yellow luminescent material YAG:Ce and the red luminescent material $Ca_{1.97}Si_5N_8:Eu_{0.03}$ which is a nitride activated with divalent Eu so as to form the white light-emitting device, however, it is difficult to stably obtain a high general color rendering index (Ra) due to a poor luminous component in the green region, and the brightness of the light-emitting device is remarkably reduced due to addition of the red luminescent material ($Ca_{1.97}Si_5N_8:Eu_{0.03}$).

An invention related to color reproducibility (NTSC ratio) of an LCD is disclosed in Japanese Patent Laying-Open No. 2003-121838, for example. This Patent Document describes that a backlight source has a spectral peak in the wavelength range of 505 to 535 nm and that a green luminescent material utilized for the backlight source contains any of europium, tungsten, tin, antimony, and manganese as an activator, specifically showing $MgGa_2O_4:Mn$ and $Zn_2SiO_4:Mn$ as the green luminescent material in embodiments of the invention.

In the case that the emission peak wavelength of a semiconductor light-emitting element is in the range of 430 to 480 nm, however, not all luminescent materials containing any of europium, tungsten, tin, antimony and manganese are preferably applicable. More specifically, $MgGa_2O_4:Mn$ and $Zn_2SiO_4:Mn$ in the embodiments shown in Japanese Patent Laying-Open No. 2003-121838 cannot provide high luminous efficiency with excitation light in the wave range of 430 to 480 nm.

Japanese Patent Laying-Open No. 2004-287323 describes that an RGB (red-green-blue)-LED formed by packaging red, green and blue LED (light-emitting diode) chips, a three-band-type fluorescent lamp, a combination of an ultraviolet LED and an RGB luminescent material, or an organic EL light source is usable as a backlight for an LCD. However, this Patent Document includes no specific description as to a red or green luminescent material suitable for blue excitation light.

U.S. Pat. No. 7,345,317 describes that a light-emitting device can emit light of a stable color regardless of fluctuation in temperature or moisture when phosphor particles contained therein are so limited as to have a particle size of not more than 20 μm and a median diameter ($d_{50}$) of not more than 5 µm. The median diameter denotes the particle size at a 50% position of particle size distribution. U.S. Pat. No. 6,812,500 describes that the mean particle size of an inorganic luminescent material contained in a light-emitting device is about 10 µm. Japanese Patent Laying-Open No. 2004-210921 describes that the particle size of phosphor particles contained in a light-emitting device is preferably in the range of 1 to 20 µm, more preferably in the range of 2 to 8 µm (according to air permeation). However, none of U.S. Pat. No. 7,345,317, U.S. Pat. No. 6,812,500 and Japanese Patent Laying-Open No. 2004-210921 describes the mutual relation between the particle sizes of a plurality of types of phosphor particles contained in a light-emitting device.

Japanese Patent Laying-Open No. 2007-049114 describes that at least one of a plurality of types of phosphor particles has an absorption band capable of absorbing light emitted from at least another type of luminescent material; a phosphor particle species for emitting light having a relatively long wavelength is distributed closer to a semiconductor light-emitting element; red light-emitting particles are divalent-europium-activated nitride phosphor particles, expressed in a general formula $(MI_{1-a}Eu_a)MIISiN_3$, capable of emitting red light by absorbing green light (wavelength: about 520 nm) and blue light (wavelength: about 450 nm) emitted from green and blue phosphor particles respectively; the plurality of types of phosphor particles have different median diameters; and liquid resin containing the plurality of types of phosphor particles is allowed to stand for a prescribed time for settling a phosphor particle species of a larger median diameter and increasing the distribution density thereof in the vicinity of the semiconductor light-emitting element; and further describes in relation to Embodiment 16 that transparent resin contains large-, medium- and small-sized phosphor particles, these phosphor particles having different particle sizes are separated substantially in a layered manner, and the median diameters of red, green and blue phosphor particles are 13 µm, 9.5 µm and 6.5 µm, respectively.

However, this Patent Document discloses a plurality of phosphor particles having different median diameters only in relation to Example 16, and there is no mention regarding control of median diameters in consideration of practical factors such as brightness and workability in relation to various types of phosphor particles.

SUMMARY OF THE INVENTION

In consideration of the aforementioned circumstances of the prior art, an object of the present invention is to provide a light-emitting device having high efficiency and excellent color rendering properties or color reproducibility (NTSC ratio) by controlling median diameters (median diameter: particle size at a position exhibiting integrated value of 50% on a volume-based particle size distribution curve: different from a mean particle size according to air permeation) of a plurality of types of phosphor particles, as a result of sufficient research and development made on technical subjects in the case of using a divalent-europium-activated nitride luminescent material ($(MI_{1-a}Eu_a)MIISiN_3$) for red light-emitting particles among a plurality of types of phosphor particles contained in a luminescence converter of a light-emitting device.

A group of phosphor particles for a light-emitting device according to the present invention contains a plurality of types of phosphor particles having different emission peak wavelengths, while phosphor particles of a type having a relatively longer emission peak wavelength have a relatively larger median diameter as compared with phosphor particles of a type having a relatively shorter emission peak wavelength.

Preferably, this group of phosphor particles for a light-emitting device contains, in addition to divalent-europium-activated nitride red phosphor particles expressed in $(MI_{1-a}Eu_a)MIISiN_3$ with a median diameter R1, at least one type of divalent-europium-activated oxynitride green phosphor particles of beta sialon expressed in $Eu_bSi_cAl_dO_eN_f$ with a median diameter G1, divalent-europium-activated oxynitride yellow phosphor particles of alpha sialon expressed in $MII_gEu_hSi_iAl_jO_kN_l$ with a median diameter Y1 and trivalent-cerium-activated silicate green phosphor particles expressed in $MIV_3(MV_{1-m}Ce_m)_2(SiO_4)_3$ with a median diameter G2, where MI represents at least one element selected from Mg, Ca, Sr and Ba; MII represents at least one element selected from Al, Ga, In, Sc, Y, La, Gd and Lu; MIII represents at least one element selected from Li, Na, K, Rb, Cs, Mg, Ca, Sr and Ba; MIV represents at least one element selected from Mg, Ca, Sr and Ba; and MV represents at least one element selected from Al, Ga, In, Sc, Y, La, Gd and Lu, wherein conditions of $0.001 \leq a \leq 0.10$; $0.005 \leq b \leq 0.4$; $c+d=12$; $e+f=16$; $0<g \leq 3.0$; $0.005 \leq h \leq 0.4$; $i+j=12$; $k+l=16$; and $0.005 \leq m \leq 0.5$ are satisfied, and conditions of $1.3 \leq R1/G1 \leq 4.0$; $1.3 \leq R1/Y1 \leq 4.0$; and $1.3 \leq R1/G2 \leq 4.0$ are satisfied.

The light-emitting device according to the present invention includes a gallium nitride semiconductor light-emitting element capable of emitting primary light having a peak wavelength in a range of 430 nm to 480 nm and a luminescence converter for absorbing the primary light and emitting secondary light having a longer peak wavelength as compared with the primary light, while the luminescence converter is formed with a single resin layer containing a group of phosphor particles satisfying the aforementioned conditions and covers the semiconductor light-emitting element.

While $(Ca_{0.98}Eu_{002})AlSiN_3$; $(Ca_{0.94}Mg_{0.05}Eu_{0.01})(Al_{0.99}In_{0.01})SiN_3$; $(Ca_{0.94}Mg_{0.05}Eu_{0.01})(Al_{0.99}Ga_{0.01})SiN_3$; $(Ca_{0.97}Sr_{0.01}Eu_{0.02})(Al_{0.99}Ga_{0.01})SiN_3$; $(Ca_{0.84}Sr_{0.15}Eu_{0.01})AlSiN_3$; $(Ca_{0.995}Eu_{0.005})AlSiN_3$; $(Ca_{0.989}Sr_{0.010}Eu_{0.001})(Al_{0.985}Ga_{0.015})SiN_3$; and $(Ca_{0.93}Mg_{0.02}Eu_{0.05})AlSiN_3$ can be specifically listed as examples of the divalent-europium-activated nitride red luminescent material in the present invention, the present invention is of course not restricted to these.

While $Eu_{0.05}Si_{11.50}Al_{0.50}O_{0.05}N_{15.95}$; $Eu_{0.10}Si_{11.00}Al_{1.00}O_{0.10}N_{15.90}$; $Eu_{0.30}Si_{9.80}Al_{2.20}O_{0.30}N_{15.70}$; $Eu_{0.15}Si_{10.00}Al_{2.00}O_{0.20}N_{15.80}$; $Eu_{0.01}Si_{11.60}Al_{0.40}O_{0.01}N_{15.99}$; and $Eu_{0.005}Si_{11.70}Al_{0.30}O_{0.03}N_{15.97}$ can be specifically listed as examples of the divalent-europium-activated oxynitride green luminescent material, i.e., beta sialon in the present invention, the present invention is of course not restricted to these.

While $Ca_{0.75}Eu_{0.01}Si_{9.75}Al_{2.25}O_{0.76}N_{15.24}$; $Ca_{0.50}Li_{0.10}Eu_{0.01}Si_{11.50}Al_{0.50}O_{0.20}N_{15.80}$; $Ca_{1.00}Sr_{0.10}Eu_{0.20}Si_{10.00}Al_{2.00}O_{0.30}N_{15.70}$; and $Ca_{0.35}Li_{0.20}Eu_{0.05}Si_{10.60}Al_{1.40}O_{1.25}N_{14.75}$ can be specifically listed as examples of the divalent-europium-activated oxynitride yellow luminescent material, i.e., alpha sialon in the present invention, the present invention is of course not restricted to these.

Further, while $Ca_3(Sc_{0.85}Ce_{0.15})_2(SiO_4)_3$; $(Ca_{0.9}Mg_{0.1})_3(Sc_{0.70}Ga_{0.15}Ce_{0.15})_2(SiO_4)_3$; $(Ca_{0.9}Mg_{0.1})_3(Sc_{0.80}Ce_{0.20})_2(SiO_4)_3$; $(Ca_{0.85}Mg_{0.15})_3(Sc_{0.50}Y_{0.20}Ce_{0.30})_2(SiO_4)_3$; $Ca_3(Sc_{0.98}In_{0.01}Ce_{0.01})_2(SiO_4)_3$; $(Ca_{0.99}Sr_{0.01})_3$ $(Sc_{0.84}In_{0.10}Y_{0.01}Ce_{0.05})_2(SiO_4)_3$; and $(Ca_{0.95}Mg_{0.05})_3(Sc_{0.80}Ce_{0.20})_2(SiO_4)_3$ can be specifically listed as examples of the trivalent-cerium-activated silicate green luminescent material in the present invention, the present invention is of course not restricted to these.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
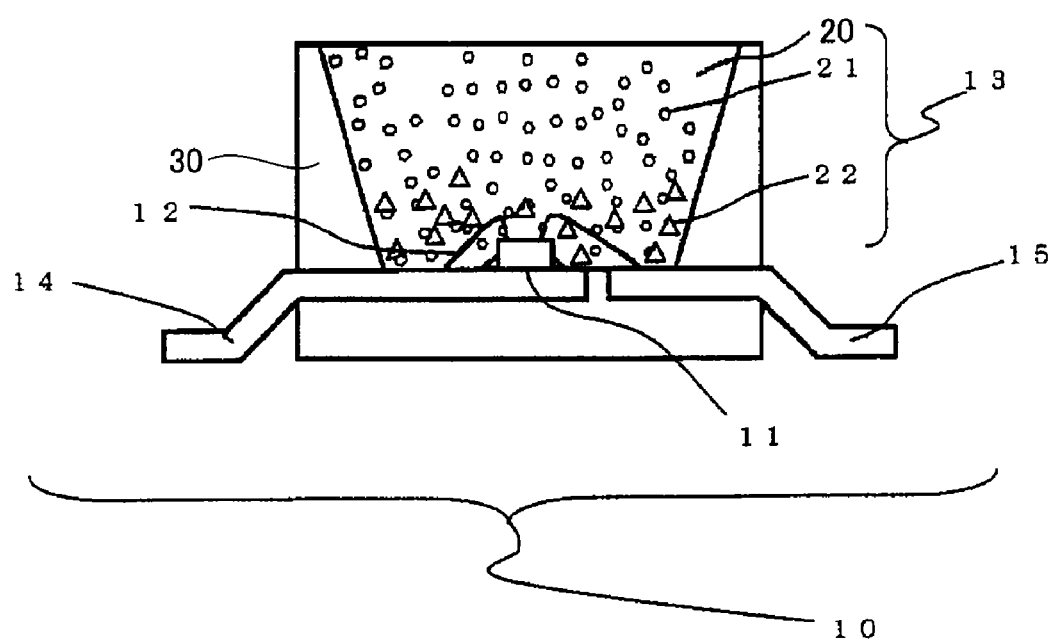
FIG. 1 is a schematic sectional view showing a light-emitting device prepared according to Example of the present invention.

FIG. 1 is a schematic sectional view showing a light-emitting device 10 prepared according to Example 1 of the present invention. This light-emitting device 10 includes a semiconductor light-emitting element 11 for emitting primary light and a luminescence converter 13 for absorbing at least part of the primary light and emitting secondary light having a larger wavelength than the primary light in a resin cup 30. Semiconductor light-emitting element 11 is placed on a cathode terminal 14, and electrically connected to cathode terminal 14 and an anode terminal 15 by gold wires 12. Luminescence converter 13 includes two types of phosphor particles 21 and 22 distributed in transparent resin 20.

A gallium nitride (GaN) semiconductor light-emitting element having an emission peak wavelength of 450 nm was employed as semiconductor light-emitting element 11. Red phosphor particles 22 having a composition $(Ca_{0.99}Eu_{0.01})AlSiN_3$ with a median diameter R1 of 15.8 μm and green phosphor particles 21 having a composition $Eu_{0.05}Si_{11.50}Al_{0.05}O_{0.05}N_{15.95}$ (beta sialon) with a median diameter G1 of 5.1 μm were used in luminescence converter 13. La-920 by Horiba, Ltd. was employed as an apparatus for measuring particle size distribution, in order to obtain the median diameters of phosphor particles 21 and 22.

Figure 2:
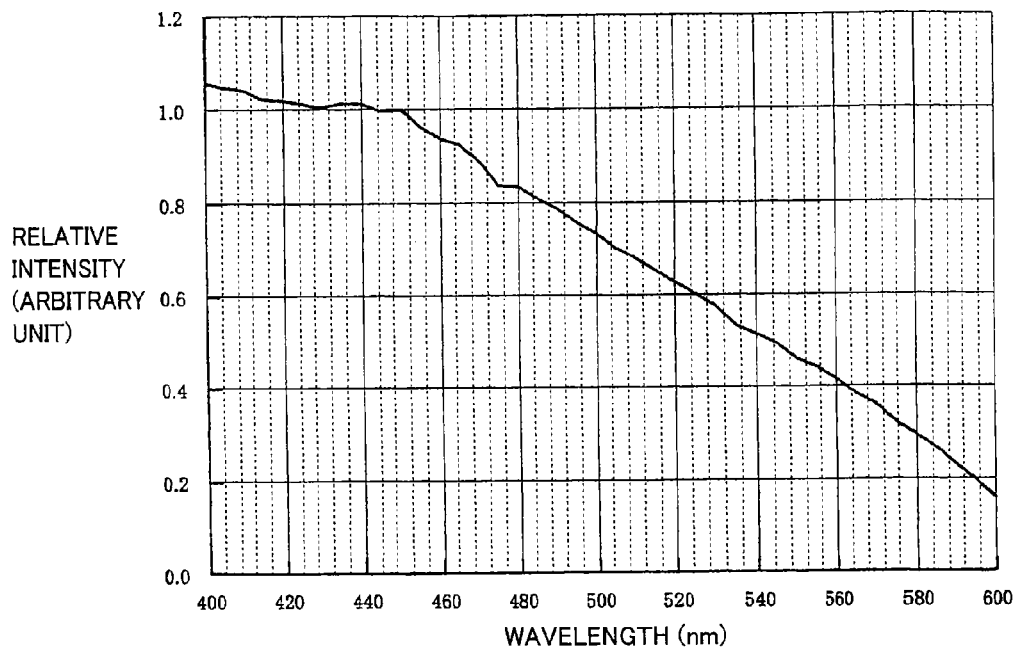
FIG. 2 is a graph showing an exemplary excitation spectral distribution chart of a nitride red luminescent material usable in the present invention.
Figure 3:
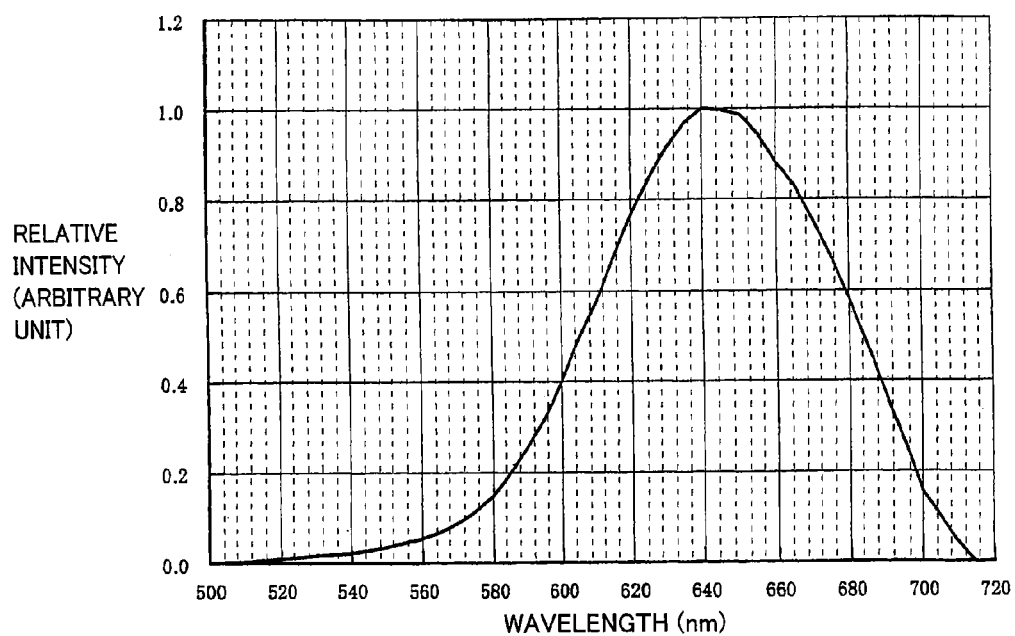
FIG. 3 is a graph showing an exemplary emission spectral distribution chart of the nitride red luminescent material shown in FIG. 2.

FIG. 2 shows spectral distribution of the red luminescent material used in Example 1. In the graph shown in FIG. 2, the axis of abscissas shows the wavelength (nm) of light, and the axis of ordinates shows the relative intensity (arbitrary unit) of light. The curve in FIG. 2 shows the excitation spectral distribution of the luminescent material. FIG. 3 shows emission spectral distribution of the red luminescent material used in Example 1.

In Example 1, luminescence converter 13 was prepared by mixing 85 mass % of green phosphor particles 21 and 15 mass % of red phosphor particles 22 together and dispersing the mixed particles, i.e., a group of phosphor particles into silicone resin 20 at a prescribed ratio. When luminescence converter 13 was prepared by charging silicone resin 20 into resin cup 30, it was possible to sediment red phosphor particles 22 larger in median diameter around semiconductor light-emitting element 11 with higher distribution density as compared with green phosphor particles 21 smaller in median diameter.

An evaluation was made regarding the characteristic (brightness) of light-emitting device 10 in Example 1 including luminescence converter 13 prepared in the aforementioned manner. In this characteristic evaluation, semiconductor light-emitting element 11 was turned on with forward current (IF) of 20 mA, and light output (light current) from light-emitting device 10 was measured.

On the other hand, a light-emitting device according to comparative example 1 was prepared similarly to Example 1, except that median diameters R1 and G1 of red and green phosphor particles having compositions identical to those in Example 1 were changed to 10.5 μm and 22.1 μm, respectively.

Table 1 shows the evaluated characteristics of the light-emitting devices of Example 1 and comparative example 1 prepared in the aforementioned manner.

TABLE 1

|  | Brightness (Relative Value) | Tc-duv |
|---|---|---|
| Example 1 | 108.1% | 7600K – 0.001 |
| Comparative Example 1 | 100.0% | 7600K – 0.001 |

It is understood from Table 1 that the light-emitting device of Example 1 is superior in characteristic (brightness) to the light-emitting device of comparative example 1. In Table 1, Tc denotes the correlated color temperature of the luminescent color of each light-emitting device, and duv denotes the deviation of a luminous chromaticity point from a blackbody radiation locus (length of a perpendicular drawn downward from a chromaticity point of a luminescent color to the blackbody radiation locus on a uv chromaticity diagram (CIE1960 uniform color space)). It is assumed that light emitted from a light-emitting device exhibiting deviation duv of not more than 0.01 is perceived as uncolored similarly to light emitted from an ordinary tungsten filament lamp. Further, it is possible to obtain natural white light at a blackbody radiation temperature of 7000 K close to the color temperature of the sun.

Example 2

A light-emitting device according to Example 2 was prepared similarly to Example 1, with a gallium nitride (GaN) semiconductor light-emitting element having a peak wavelength of 460 nm employed as semiconductor light-emitting element 11.

In Example 2, red phosphor particles 22 having a composition $(Ca_{0.96}Sr_{0.03}Eu_{0.01})AlSiN_3$ with a median diameter R1 of 12.6 μm and green phosphor particles 21 having a composition $(Ca_{0.98}Mg_{0.02})_3(Sc_{0.90}Ce_{0.10})_2(SiO_4)_3$ with a median diameter G2 of 6.0 μm were used in luminescence converter 13.

According to Example 2, luminescence converter 13 was prepared by mixing 74.9 mass % of green phosphor particles 21 and 25.1 mass % of red phosphor particles 22 together and dispersing the mixed particles, i.e., a group of phosphor particles into silicone resin 20 at a prescribed ratio.

The characteristic (brightness) of light-emitting device 10 of Example 2 including luminescence converter 13 prepared in the aforementioned manner was also evaluated under conditions similar to those in Example 1.

On the other hand, a light-emitting device according to comparative example 2 was prepared similarly to Example 2, Emitting Device ($\lambda p$)" shows the emission peak wavelengths of semiconductor light-emitting elements 11.

TABLE 3

| | Light-Emitting Device ($\lambda p$) | Phosphor particles | Median Diameter ($\mu m$) | Brightness (Relative Value) | Tc-duv |
|---|---|---|---|---|---|
| Example 3 | 440 nm | R1: $(Ca_{0.99}Eu_{0.01})(Al_{0.95}Ga_{0.05})SiN_3$ | 18.6 | 105.6% | 2900K + 0.001 |
| | | Y1: $Ca_{0.70}Li_{0.05}Eu_{0.025}Si_{9.75}Al_{2.25}O_{0.75}N_{15.25}$ | 9.3 | | |
| Comparative Example 3 | 440 nm | R1: $(Ca_{0.99}Eu_{0.01})(Al_{0.95}Ga_{0.05})SiN_3$ | 5.8 | 100.0% | |
| | | Y1: $Ca_{0.70}Li_{0.05}Eu_{0.025}Si_{9.75}Al_{2.25}O_{0.75}N_{15.25}$ | 13.1 | | |
| Example 4 | 470 nm | R1: $(Ca_{0.985}Eu_{0.015})(Al_{0.99}In_{0.01})SiN_3$ | 18.9 | 108.3% | 8100K + 0.002 |
| | | G1: $Eu_{0.01}Si_{11.80}Al_{0.20}O_{0.04}N_{15.96}$ | 8.1 | | |
| Comparative Example 4 | 470 nm | R1: $(Ca_{0.985}Eu_{0.015})(Al_{0.99}In_{0.01})SiN_3$ | 8.8 | 100.0% | |
| | | G1: $Eu_{0.01}Si_{11.80}Al_{0.20}O_{0.04}N_{15.96}$ | 23.6 | | |
| Example 5 | 430 nm | R1: $(Ca_{0.98}Eu_{0.02})AlSiN_3$ | 20.5 | 107.8% | 5900K + 0.000 |
| | | G2: $(Ca_{0.99}Mg_{0.01})_3(Sc_{0.79}Y_{0.01}Ce_{0.20})_2(SiO_4)_3$ | 5.1 | | |
| Comparative Example 5 | 430 nm | R1: $(Ca_{0.98}Eu_{0.02})AlSiN_3$ | 6.1 | 100.0% | |
| | | G2: $(Ca_{0.99}Mg_{0.01})_3(Sc_{0.79}Y_{0.01}Ce_{0.20})_2(SiO_4)_3$ | 16.0 | | |
| Example 6 | 480 nm | R1: $(Ca_{0.98}Sr_{0.01}Eu_{0.01})AlSiN_3$ | 13.5 | 107.1% | 3000K + 0.002 |
| | | Y1: $Ca_{0.40}Mg_{0.10}Eu_{0.03}Si_{10.00}Al_{2.00}O_{1.10}N_{14.90}$ | 9.0 | | |
| Comparative Example 6 | 480 nm | R1: $(Ca_{0.98}Sr_{0.01}Eu_{0.01})AlSiN_3$ | 7.8 | 100.0% | |
| | | Y1: $Ca_{0.40}Mg_{0.10}Eu_{0.03}Si_{10.00}Al_{2.00}O_{1.10}N_{14.90}$ | 15.5 | | |
| Example 7 | 450 nm | R1: $(Ca_{0.99}Eu_{0.01})AlSiN_3$ | 22.5 | 106.9% | 8500K + 0.001 |
| | | G2: $(Ca_{0.97}Mg_{0.03})_3(Sc_{0.85}Ce_{0.15})_2(SiO_4)_3$ | 6.4 | | |
| Comparative Example 7 | 450 nm | R1: $(Ca_{0.99}Eu_{0.01})AlSiN_3$ | 10.2 | 100.0% | |
| | | G2: $(Ca_{0.97}Mg_{0.03})_3(Sc_{0.85}Ce_{0.15})_2(SiO_4)_3$ | 17.5 | | |
| Example 8 | 455 nm | R1: $(Ca_{0.99}Eu_{0.01})AlSiN_3$ | 8.3 | 105.9% | 6100K − 0.001 |
| | | G1: $Eu_{0.01}Si_{11.80}Al_{0.20}O_{0.04}N_{15.96}$ | 6.5 | | |
| Comparative Example 8 | 455 nm | R1: $(Ca_{0.99}Eu_{0.01})AlSiN_3$ | 7.6 | 100.0% | |
| | | G1: $Eu_{0.01}Si_{11.80}Al_{0.20}O_{0.04}N_{15.96}$ | 14.2 | | | except that median diameters R1 and G1 of red and green phosphor particles having compositions identical to those in Example 2 were changed to 7.6 $\mu m$ and 14.3 $\mu m$, respectively.

Table 2 shows the evaluated characteristics of the light-emitting devices of Example 2 and comparative example 2 prepared in the aforementioned manner.

TABLE 2

| | Brightness (Relative Value) | Tc-duv |
|---|---|---|
| Example 2 | 107.5% | 6600K + 0.003 |
| Comparative Example 2 | 100.0% | 6600K + 0.003 |

It is understood from Table 2 that the light-emitting device of Example 2 is also superior in characteristic (brightness) to the light-emitting device of comparative example 2.

Examples 3 to 8

Light-emitting devices according to Examples 3 to 8 and comparative examples 3 to 8 were prepared similarly to those according to Examples 1 and 2 and comparative examples 1 and 2. In the light-emitting devices of Examples 3 to 8, the types and median diameters of phosphor particles contained in luminescence converters 13 were changed in various ways. In the light-emitting devices of comparative examples 3 to 8, on the other hand, only the median diameters were changed as compared with the corresponding Examples 3 to 8, respectively.

Table 3 shows the evaluated characteristics of the light-emitting devices of Examples 3 to 8 and comparative examples 3 to 8 prepared in the aforementioned manner. R1, Y1, G1 and G2 in Table 3 denote the types and median diameters of the phosphor particles. The column of "Light- It is understood from Table 3 that the light-emitting devices of Examples 3 to 8 are also superior in characteristic (brightness) to the light-emitting devices of comparative examples 3 to 8, respectively.

From the aforementioned Examples 1 to 8 and comparative examples 1 to 8, it is understood that the light-emitting device exhibits excellent characteristics when the ratio between the median diameters of various phosphor particles satisfies the condition of $1.3 \leq R1/G1 \leq 4.0$; $1.3 \leq R1/Y1 \leq 4.0$; or $1.3 \leq R1/G2 \leq 4.0$. If the ratio between the median diameters is less than 1.3, the brightness of the light-emitting device is not sufficiently improved and not suitable for practical use. If the ratio between the median diameters exceeds 4.0, on the other hand, a nozzle for molding transparent resin 20 containing phosphor particles 21 and 22 tends to be easily clogged.

The median diameter R1 of divalent-europium-activated nitride red phosphor particles is preferably in the range of 7 $\mu m \leq R1 \leq 19$ $\mu m$, more preferably in the range of 10 $\mu m$ to 16 $\mu m$. If the median diameter R1 is less than 7 $\mu m$, the median diameter G1, G2 or Y1 must be less than 5.4 $\mu m$. In this case, green and yellow phosphor particles tend to be insufficient in their crystal growth and it becomes difficult to obtain sufficient brightness. If the median diameter R1 exceeds 19 $\mu m$, on the other hand, coarse particles conspicuously formed in crystal growth of the nitride red phosphor particles, and this is not practically preferable.

While the light-emitting device exhibits good characteristics if the aforementioned conditions hold in relation to the median diameters G1, Y1 and G2 of oxynitride green phosphor particles, oxynitride yellow phosphor particles and silicate green phosphor particles respectively, the median diameters G1, Y1 and G2 are preferably at least 5.4 $\mu m$ as described above, in consideration of the brightness of the light-emitting device.

If the emission peak wavelength of semiconductor light-emitting element 11 in the light-emitting device exceeds 480 nm, the brightness of white light emitted from the light-emitting device tends to lower to a level not suitable for practical use. If the emission peak wavelength of semiconductor light-emitting element 11 is less than 430 nm, on the other hand, contribution of the blue light component is reduced whereby causing deterioration in color rendering properties, and this is not practically preferable either.

While at least one of Al, Ga and In can be preferably selected as the trivalent metallic element MII in the general formula of the nitride red luminescent material, Al is most preferable in view of the effect of improving the brightness of the light-emitting device. While at least one of Ga, In, Sc and Y can be preferably selected as the trivalent metallic element MV in the general formula of the silicate green luminescent material, Sc is most preferable in view of the effect of improving the brightness of the light-emitting device.

While the combination of only two types of phosphor particles has exemplarily been shown in each of the above various Examples, a combination of at least three types of phosphor particles may also be utilized, as a matter of course.

According to the present invention, as hereinabove described, a light-emitting device, having high efficiency and excellent color rendering properties or color reproducibility (NTSC ratio), capable of emitting white light by efficiently absorbing light from a semiconductor light-emitting element can be provided by applying a combination of nitride red phosphor particles, oxynitride green phosphor particles, oxynitride yellow phosphor particles and/or silicate green phosphor particles having controlled median diameters to a luminescence converter.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A group of phosphor particles for a light-emitting device containing, in addition to divalent-europium-activated nitride red phosphor particles expressed in $(MI_{1-a}Eu_a)MIISiN_3$ with a median diameter R1, at least one type of:

divalent-europium-activated oxynitride green phosphor particles of beta sialon expressed in $Eu_bSi_cAl_dO_eN_f$ with a median diameter G1;

divalent-europium-activated oxynitride yellow phosphor particles of alpha sialon expressed in $MII_gEu_hSi_iAl_jO_kN_l$ with a median diameter Y1; and trivalent-cerium-activated silicate green phosphor particles expressed in $MIV_3(MV_{1-m}Ce_m)_2(SiO_4)_3$ with a median diameter G2, wherein MI represents at least one element selected from Mg, Ca, Sr and Ba, MII represents at least one element selected from Al, Ga, In, Sc, Y, La, Gd and Lu, MIII represents at least one element selected from Li, Na, K, Rb, Cs, Mg, Ca, Sr and Ba, MIV represents at least one element selected from Mg, Ca, Sr and Ba, and MV represents at least one element selected from Al, Ga, In, Sc, Y, La, Gd and Lu, conditions of $0.001 \leq a \leq 0.10$; $0.005 \leq b \leq 0.4$; $c+d=12$; $e+f=16$; $0<g \leq 3.0$; $0.005 \leq h \leq 0.4$; $i+j=12$; $k+l=16$; and $0.005 \leq m \leq 0.5$ are satisfied, and conditions of $1.3 \leq R1/G1 \leq 4.0$; $1.3 \leq R1/Y1 \leq 4.0$; and $1.3 R1/G2 \leq 4.0$ are satisfied.

2. The group of phosphor particles for a light-emitting device according to claim 1, wherein MII represents at least one element selected from Al, Ga and In.

3. The group of phosphor particles for a light-emitting device according to claim 1, wherein MV represents at least one element selected from Ga, In, Sc and Y.

4. The group of phosphor particles for a light-emitting device according to claim 1, wherein said median diameter R1 is in a range of $7 \mu m \leq R1 \leq 19 \mu m$.

5. A light-emitting device including:

a gallium nitride semiconductor light-emitting element capable of emitting primary light having a peak wavelength in a range of 430 nm to 480 nm and a luminescence converter for absorbing said primary light and emitting secondary light having a longer peak wavelength as compared with said primary light, wherein said luminescence converter is formed with a single resin layer containing the group of phosphor particles of claim 1 and covers said semiconductor light-emitting element.

6. The light-emitting device according to claim 5, wherein the distribution density of said phosphor particles of a type having a relatively longer fluorescent peak wavelength and a relatively larger median diameter is increased at a position closer to said semiconductor light-emitting element as compared with a position farther from said semiconductor light-emitting element in said resin layer.

7. A backlight for a liquid crystal display, including the light-emitting device of claim 5.

* * * * *